US009166163B2

(12) United States Patent
Gee et al.

(10) Patent No.: US 9,166,163 B2
(45) Date of Patent: Oct. 20, 2015

(54) SUB-OXIDE INTERFACE LAYER FOR TWO-TERMINAL MEMORY

(71) Applicant: Crossbar, Inc., Santa Clara, CA (US)

(72) Inventors: Harry Yue Gee, Santa Clara, CA (US); Mark Harold Clark, Santa Clara, CA (US); Steven Patrick Maxwell, Sunnyvale, CA (US); Sung Hyun Jo, Sunnyvale, CA (US); Natividad Vasquez, Jr., San Francisco, CA (US)

(73) Assignee: Crossbar, Inc., Santa Clara, CA (US)

( * ) Notice: Subject to any disclaimer, the term of this patent is extended or adjusted under 35 U.S.C. 154(b) by 84 days.

(21) Appl. No.: 14/027,045

(22) Filed: Sep. 13, 2013

(65) Prior Publication Data
US 2014/0145135 A1     May 29, 2014

Related U.S. Application Data

(63) Continuation-in-part of application No. 13/525,096, filed on Jun. 15, 2012, now Pat. No. 9,058,865, and a continuation-in-part of application No. 13/586,815, filed on Aug. 15, 2012, now Pat. No. 8,946,669, and a (Continued)

(51) Int. Cl.
*G11C 11/00*     (2006.01)
*H01L 45/00*     (2006.01)

(52) U.S. Cl.
CPC .......... *H01L 45/1608* (2013.01); *H01L 45/085* (2013.01); *H01L 45/1226* (2013.01); *H01L 45/1233* (2013.01); *H01L 45/145* (2013.01); *H01L 45/1633* (2013.01)

(58) Field of Classification Search
CPC .............. H01L 45/1608; H01L 45/085; H01L 45/1233; H01L 45/1633
USPC ........................................... 365/148; 257/4, 5
See application file for complete search history.

(56) References Cited

U.S. PATENT DOCUMENTS

| | | | | |
|---|---|---|---|---|
| 8,569,104 | B2 * | 10/2013 | Pham et al. .................... | 438/102 |
| 2012/0241710 | A1 * | 9/2012 | Liu et al. ............................ | 257/4 |
| 2013/0279240 | A1 * | 10/2013 | Jo ................................. | 365/148 |
| 2013/0308369 | A1 * | 11/2013 | Lu et al. ......................... | 365/148 |
| 2014/0029327 | A1 * | 1/2014 | Strachan et al. .............. | 365/148 |
| 2014/0175360 | A1 * | 6/2014 | Tendulkar et al. ................ | 257/4 |
| 2014/0192589 | A1 * | 7/2014 | Maxwell et al. .............. | 365/148 |
| 2014/0197369 | A1 * | 7/2014 | Sheng et al. ...................... | 257/4 |
| 2014/0264236 | A1 * | 9/2014 | Kim et al. .......................... | 257/4 |
| 2014/0264250 | A1 * | 9/2014 | Maxwell et al. ................... | 257/5 |
| 2014/0268997 | A1 * | 9/2014 | Nazarian et al. .............. | 365/148 |

(Continued)

*Primary Examiner* — Viet Q Nguyen
(74) *Attorney, Agent, or Firm* — Amin, Turocy & Watson, LLP

(57) ABSTRACT

Provision of fabrication, construction, and/or assembly of a two-terminal memory device is described herein. The two-terminal memory device can include an active region with a silicon bearing layer, an interface layer, and an active metal layer. The interface layer can created comprising a non-stoichimetric sub-oxide that can be a combination of multiple silicon and/or silicon oxide layers with an aggregate chemical formula of $SiO_X$, where X can be a non-integer greater than zero and less than 2. The sub-oxide can be created in a variety of ways, including various techniques related to growing the sub-oxide, depositing the sub-oxide, or transforming an extant film into the sub-oxide.

29 Claims, 11 Drawing Sheets

Related U.S. Application Data continuation-in-part of application No. 13/585,759, filed on Aug. 14, 2012, now Pat. No. 8,569,172, and a continuation-in-part of application No. 13/912,136, filed on Jun. 6, 2013.

(60) Provisional application No. 61/786,100, filed on Mar. 14, 2013, provisional application No. 61/503,477, filed on Jun. 30, 2011, provisional application No. 61/620,561, filed on Apr. 5, 2012, provisional application No. 61/712,171, filed on Oct. 10, 2012, provisional application No. 61/786,058, filed on May 8, 2013.

(56) References Cited

U.S. PATENT DOCUMENTS

| 2014/0269002 A1* | 9/2014 | Jo | 365/148 |
| 2014/0312296 A1* | 10/2014 | Jo et al. | 257/4 |

* cited by examiner

SUB-OXIDE INTERFACE LAYER FOR TWO-TERMINAL MEMORY

CROSS-REFERENCE TO RELATED APPLICATIONS

The instant application claims priority to and is a non-provisional of U.S. Application No. 61/786,100 filed Mar. 14, 2013. This application is also a continuation-in-part of U.S. patent application Ser. No. 13/525,096 filed Jun. 15, 2012, which claims the benefit of U.S. provisional patent application No. 61/503,477 filed on Jun. 30, 2011. This application is a continuation-in-part of U.S. patent application Ser. No. 13/586,815 filed Aug. 15, 2012, which claims the benefit of U.S. provisional patent application No. 61/620,561 filed on Apr. 5, 2012. This application is a continuation-in-part of U.S. patent application Ser. No. 13/585,759 filed Aug. 14, 2012. This application claims the benefit of U.S. provisional patent application No. 61/712,171 filed on Oct. 10, 2012. This application is a continuation-in-part of U.S. patent application Ser. No. 13/912,136 filed Jun. 6, 2013, which claims the benefit of U.S. provisional patent application No. 61/786,058 filed on Mar. 14, 2013. The entireties of these applications are incorporated herein by reference.

TECHNICAL FIELD

This disclosure generally relates to semiconductor fabrication, and more particularly to creating a sub-oxide for two-terminal memory cells with suitable characteristics to operate as an interface layer.

BACKGROUND

Resistive-switching memory represents a recent innovation within the field of integrated circuit technology. While much of resistive-switching memory technology is in the development stage, various technological concepts for resistive-switching memory have been demonstrated by the inventors and are in one or more stages of verification to prove or disprove associated theories or techniques. The inventors believe that resistive-switching memory technology shows compelling evidence to hold substantial advantages over competing technologies in the semiconductor electronics industry.

The inventors believe that resistive-switching memory cells can be configured to have multiple states with distinct resistance values. For instance, for a single bit cell, the restive-switching memory cell can be configured to exist in a relatively low resistance state or, alternatively, in a relatively high resistance state. Multi-bit cells might have additional states with respective resistances that are distinct from one another and distinct from the relatively low resistance state and the relatively high resistance state. The distinct resistance states of the resistive-switching memory cell represent distinct logical information states, facilitating digital memory operations. Accordingly, the inventors believe that arrays of many such memory cells, can provide many bits of digital memory storage.

The inventors have been successful in inducing resistive-switching memory to enter one or another resistive state in response to an external condition. Thus, in transistor parlance, applying or removing the external condition can serve to program or de-program (e.g., erase) the memory. Moreover, depending on physical makeup and electrical arrangement, a resistive-switching memory cell can generally maintain a programmed or de-programmed state. Maintaining a state might require other conditions be met (e.g., existence of a minimum operating voltage, existence of a minimum operating temperature, and so forth), or no conditions be met, depending on the characteristics of a memory cell device.

The inventors have put forth several proposals for practical utilization of resistive-switching technology to include transistor-based memory applications. For instance, resistive-switching elements are often theorized as viable alternatives, at least in part, to metal-oxide semiconductor (MOS) type memory transistors employed for electronic storage of digital information. Models of resistive-switching memory devices provide some potential technical advantages over non-volatile FLASH MOS type transistors.

In light of the above, the inventors desire to continue developing practical utilization of resistive-switching technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Systems and methods disclosed herein relate to fabrication of a two-terminal memory device with an interface layer comprising a silicon sub-oxide. For example, a memory fabrication component can facilitate fabrication of a two-terminal memory cell with an active region comprising a silicon bearing layer, an interface layer comprising a non-stoichimetric sub-oxide (e.g., $SiO_x$, $0<x<2$; $Si_xGe_yO_z$ $x\geq0$, $y\geq0$, $z\geq0$, $x+y\leq z\leq 2*(x+y)$, or the like) situated atop the silicon bearing layer, and an active metal layer situated atop the interface layer. The memory fabrication component can include a creation component and a sealing component. The creation component can be configured to facilitate creation of the interface layer during a formation period. Said creation can be according to one or more of many distinct techniques. The interface layer that comprises the sub-oxide can have a thickness that is less than about eight nanometers. The sealing component can be configured to facilitate deposition of the active metal layer in response to expiration of the formation period.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION INTRODUCTION

In two-terminal memory cells, particularly resistive-switching memory cells, the portions of the cell between the two terminals are denoted herein as the active region of the cell. This active region can include an interface layer between a silicon bearing layer and an active metal layer, all of which are further detailed herein. In some embodiments, the silicon bearing layer can be a conductive silicon bearing layer. The interface layer plays a significant role in the switching properties of a two-terminal memory cell (e.g., a resistive-switching memory cell such as a resistive random access memory (RRAM) cell). In some memory cells, the interface layer is composed of amorphous silicon, that is, a semiconductor material composed of silicon or a derivative of silicon that is in an amorphous state. The inventors have proposed that the interface layer can be composed of a silicon sub-oxide that is in addition to or alternative to the amorphous silicon. The sub-oxide can be a mixture of many different silicon-based elements or oxides, such as silicon, silicon monoxide, and/or silicon dioxide. In the aggregate, this sub-oxide can exhibit desirable characteristics as an interface layer of a two-terminal memory device; and can be represented with a chemical formula that is a function of the various different elements or oxides. For example, as $SiO_X$, where X can be a non-integer and can greater than zero and less than 2, as $Si_xGe_yO_z$, where $x \geq 0$, $y \geq 0$, $z \geq 0$, $x+y \leq z \leq 2$ $(x+y)$, or the like.

Figure 5:
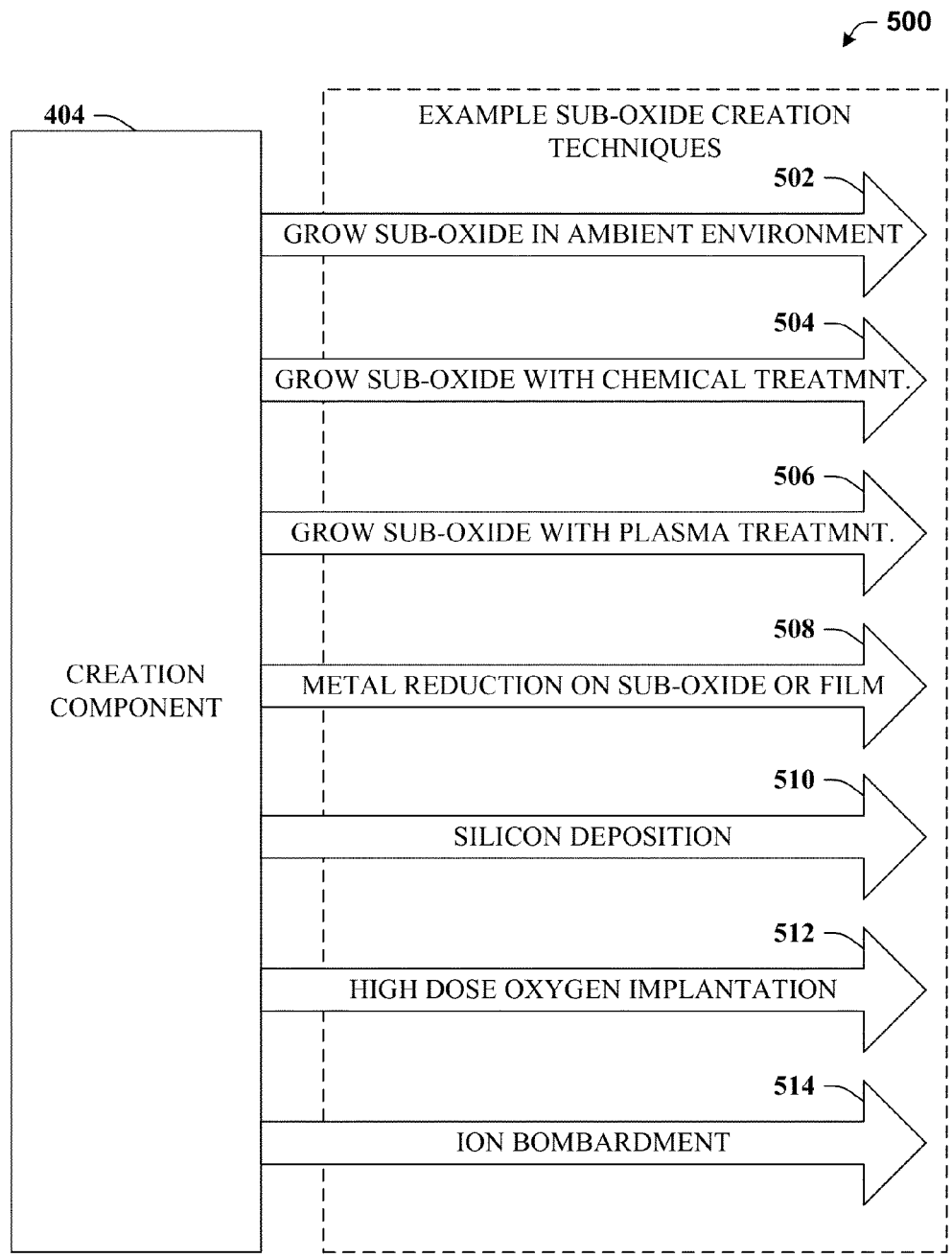
FIG. 5 illustrates a block diagram of an example creation component in more detail that can provide for numerous example silicon sub-oxide creation techniques in accordance with certain embodiments of this disclosure.

The interface layer and/or sub-oxide can be created in a variety of ways, numerous examples of which are provided with reference to FIG. 5. For example, the sub-oxide can be grown, deposited, or an existing film or oxide (or sub-oxide) can be transformed by a particular treatment or technique. In some cases, various techniques can be utilized in combination with other techniques to create the sub-oxide. In some embodiments, the sub-oxide can be created by using material included in the silicon bearing layer or another material that is in the interface layer such as a grown or deposited film which can be an oxide or another sub-oxide, and can be in combination with an amorphous silicon material.

Given the numerous techniques provided herein for creating the sub-oxide, the inventors believe an associated memory cell as well as a memory array (e.g., a crossbar array) can be constructed with target characteristics to suit many practical applications, which is further detailed in connection with FIGS. 2-3B. Further, memory fabricators are afforded a range of options to select a technique that is most compatible with existing facilities, equipment, designs, logistics, or business strategies.

Example of Creating a Silicon Sub-Oxide for Two-Terminal Memory

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure may be practiced without these specific details, or with other methods, components, materials, etc. In other instances, well-known structures and devices are shown in block diagram form to facilitate describing the subject disclosure.

Figure 1A:
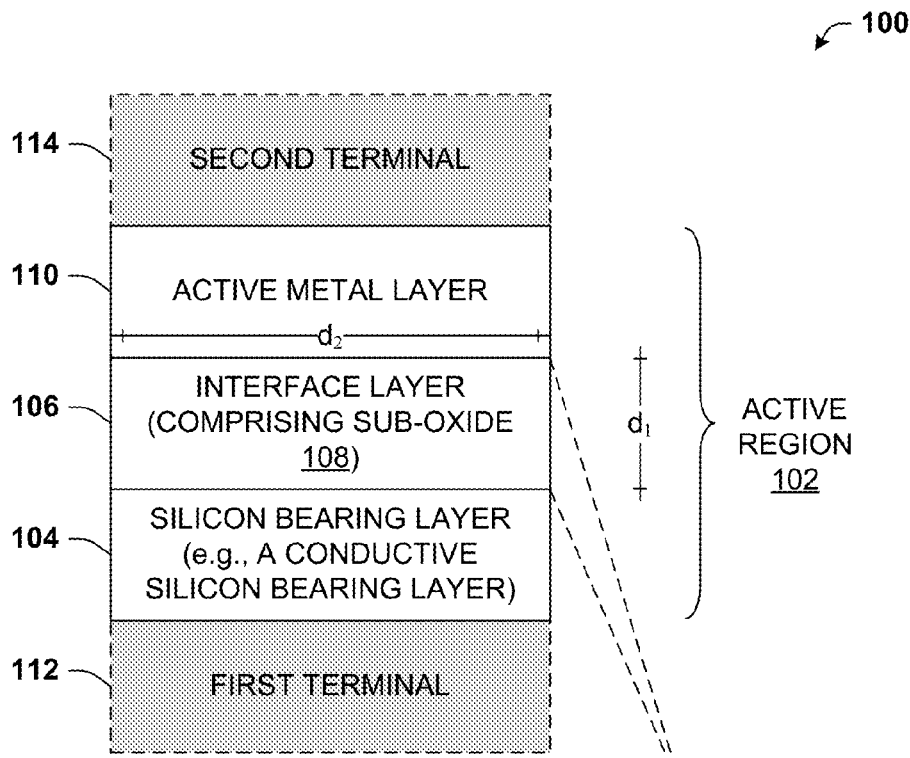
FIGS. 1A-B illustrate block diagrams of an example two-terminal memory cell or device in accordance with certain embodiments of this disclosure.
Figure 1B:
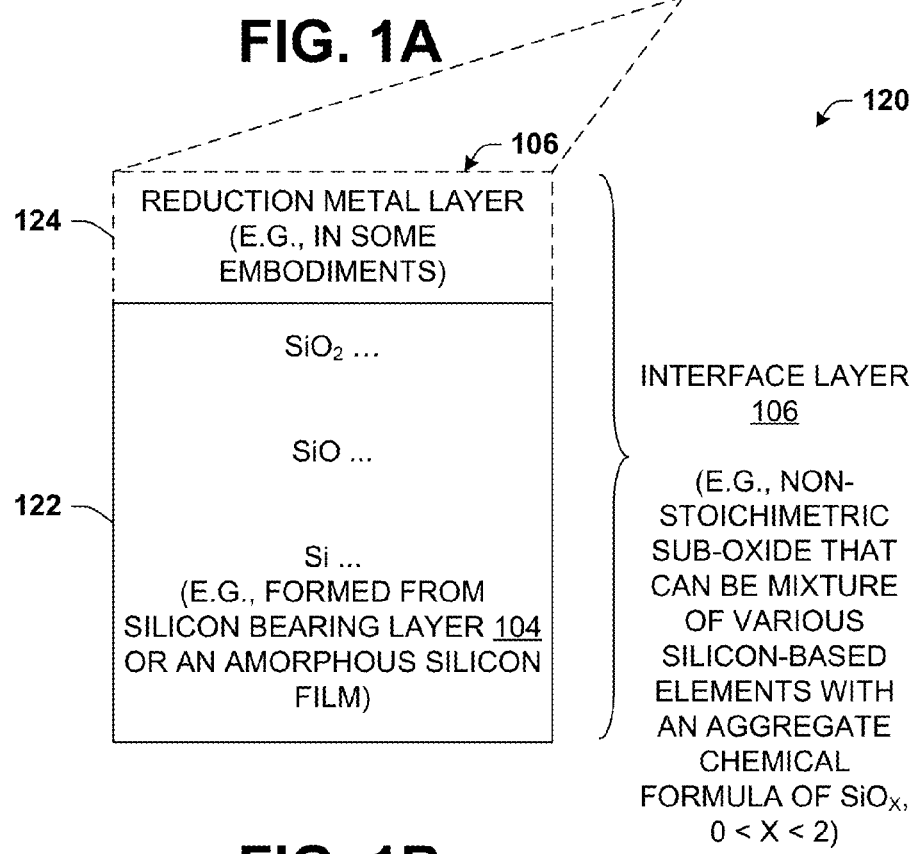

Referring initially to FIG. 1A, an example two-terminal memory device 100 is depicted. Device 100 can be a resistive-switching memory device such as a resistive random access memory (RRAM) device, for which certain illustrative characteristics or aspects are provided with reference to FIGS. 2-3B. Device 100 may be formed on top of an insulating substrate upon which one or more CMOS devices have been formed. In some embodiments, the CMOS devices include control transistors/control logic that are coupled to terminals of the two-terminal memory device. In some embodiments, device 100 can be a arranged in a column-based stack as illustrated in FIGS. 1A and 1B. Additionally or alternatively, device 100 can be arranged laterally, an example of which can be found at FIG. 6C.

Two-terminal memory cell 100 can include an active region 102 that can be situated between a first terminal 112 and second terminal 114 that comprise one or more electrical conductive metals. Active region 102 can be created comprising silicon bearing layer 104, interface layer 106, and active metal layer 110. Interface layer 106 can be composed of or comprise one or more engineered or controlled oxide(s), which is referred to herein as sub-oxide 108.

In some embodiments, the engineered or controlled sub-oxide 108 can have a thickness (e.g., $d_1$) that is within a range of about 2 nanometers to about 8 nanometers. In some embodiments, active region 102 can have a width (e.g., denoted $d_2$) that is in a range of about 20 nanometers to about 300 nanometers; in a range of about 2 nanometer to about 50 nanometers, or the like. In some embodiments, sub-oxide 108 can have a non-stoichimetric property such that exact proportions or exact arrangements are not necessary or are of less importance than certain operational characteristics that might be obtained via many different proportions or arrangements.

Diagram 120 of FIG. 1B depicts an example interface layer 106 for device 100 in more detail. For instance, interface layer 106 can include silicon layer 122, which can be a mixture of $SiO_2$, SiO, Si with an aggregate composition of, e.g., $SiO_x$, or in embodiments with germanium, $Si_xGe_yO_z$. Silicon layer 122 can be formed from silicon bearing layer 104 or from some other extant layer or film, possibly in combination with an amorphous silicon film. Silicon (Si) in silicon bearing layer 122 can oxidize when an associated surface is exposed to oxygen. Thus, depending on the technique for creating sub-oxide 108, silicon monoxide (SiO) can form that can be composed predominantly of SiO, that can grow or otherwise be created in response to an oxidation process. The SiO can undergo further oxidation to grow (or otherwise create) silicon dioxide ($SiO_2$) that can be predominantly composed of $SiO_2$.

In some embodiments, particularly those in connection with a metal reduction technique detailed herein, reduction metal layer 124 can also exist. It is understood that other layers, elements, or compounds can exist in a given interface layer 106 and/or other layers (not shown) might be present. Such can depend on the technique employed to create sub-oxide 108 or on desired characteristics (e.g., switching properties) of two-terminal memory device 100. It is also understood that although SiO is depicted as being situated atop Si, $SiO_2$ atop SiO, and so forth, such is merely an example, and need not be the case in all embodiments. Rather, in some embodiments a different arrangement can exist, which can be a function of the technique employed to create sub-oxide 108 and/or a characteristic desired for an associated device 100. It is appreciated that interface layer 106 can comprise a non-stoichimetric sub-oxide (e.g., sub-oxide 108) that can be a combination or mixture, possibly non-homogenous, of various silicon-based layers or elements with an aggregate chemical formula of $SiO_X$, where $0<X<2$. As another example, the aggregate chemical formula can be $Si_xGe_yO_z$, where $x \geq 0$, $y \geq 0$, $z \geq 0$, $x+y \leq z \leq 2$ $(x+y)$. Other examples can exist.

Although described in more detail herein, it is here noted that in some embodiments, silicon bearing layer 104 can be comprised of a positive (p) type semiconductor material. In some embodiments, silicon bearing layer 104 can have a thickness in a range of about 20 nanometers to about 250 nanometers, in a range of about 2 nm to about 50 nm, or the like. In some embodiments, silicon bearing layer 104 can have a doping coefficient in a range of about 0.001 ohm-cm to about 10 ohm-cm. In some embodiments, active metal layer 110 can comprise silver.

Figure 2:
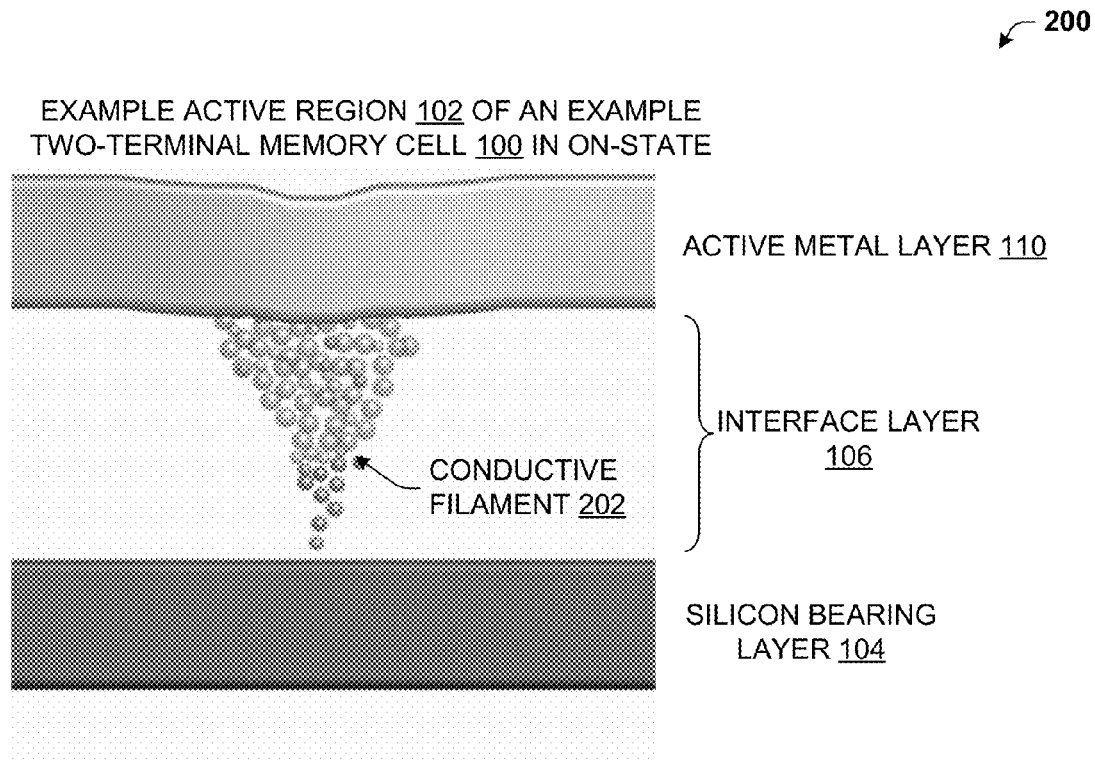
FIG. 2 depicts an example illustration of a cross-section of an example active region of an example two-terminal memory cell in accordance with certain embodiments of this disclosure.

While still referring to FIG. 1, but turning also now to FIG. 2, illustration 200 is provided. Illustration 200 depicts a cross-section of an example active region 102 of an example two-terminal memory cell 100. In order to provide additional detail or context, it is understood that this disclosure relates to two-terminal memory cells, particularly resistive switching two-terminal memory cells, in various embodiments. Resistive switching two-terminal memory cells (also referred to as resistive switching memory cells or devices), as utilized herein, comprise circuit components having two electrical contacts (also referred to herein as electrodes or terminals) with an active region (e.g., active region 102) between the two conductive contacts (e.g., terminals 112, 114).

An example of the active region 102 of the two-terminal memory device 100 is provided by illustration 200. This active region 102 can exhibit a plurality of stable or semi-stable resistive states, each resistive state having different electrical characteristics (e.g., resistance). Moreover, respective states of the plurality of states can be formed or activated in response to a respective voltage difference applied at the two conductive contacts. One example of a resistive switching two-terminal memory device, though not exhaustive, can include a resistive random access memory (RRAM) cell or device.

Embodiments of the subject disclosure can provide a filamentary-based memory cell. For example, in a 'programmed' or 'on' state, conductive filament 202 can form when ions from active metal layer 110 permeate interface layer 106, generally in response to a program voltage applied across the terminals 112, 114, which is further detailed infra. One example of a filamentary-based memory cell can comprise: a p-type (positive) or n-type (negative) silicon bearing layer 104; the interface layer 106 (also referred to as a resistive switching layer or a resistive switching material layer), which in this case can comprise sub-oxide 108, and active metal layer 110 for providing filament forming ions to the interface layer 106. The p-type or n-type silicon bearing layer 104 can include a p-type or n-type polysilicon, p-type or n-type SiGe, or the like. The interface layer 106 can comprise, e.g., an undoped amorphous silicon layer or mixture, a doped polysilicon layer or mixture, a doped silicon germanium layer or mixture, a semiconductor layer or mixture having intrinsic characteristics, a silicon sub-oxide layer or mixture, and so forth.

Examples of the active metal layer 110 can include, among others: silver (Ag), gold (Au), titanium (Ti), nickel (Ni), aluminum (Al), chromium (Cr), tantalum (Ta), iron (Fe), manganese (Mn), tungsten (W), vanadium (V), cobalt (Co), platinum (Pt), and palladium (Pd)). Other suitable conductive materials, as well as compounds or combinations of the foregoing can be employed for the active metal layer 110 in some aspects. Some details pertaining to embodiments of the subject disclosure similar to the foregoing example can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

Generally, to program one or more memory cell, a suitable program voltage can be applied across the memory cell causing a conductive filament to form through a resistive portion (e.g., interface layer) of the memory cell as mentioned above. This can further cause the memory cell to switch from a relatively high resistive state, to a relatively low resistive state. An erase process can be implemented to reverse the foregoing, at least in part, causing the memory cell to return to the high resistive state from the low resistive state. This physical change of state, in the context of memory, can be associated with respective logical states of a binary bit. Accordingly, multiple such memory cells can be programmed or erased to represent respective zeroes or ones of binary information and, by retaining those states over time, in effect persist binary information. For various reasons, in some embodiments, resistive switching memory cells are generally quick to program and responsive, changing state readily in response to a program voltage or an erase voltage. This quick switching of state is a significant advantage of various disclosed memory cells over other memory cell technologies.

As applied to illustration 200, when a suitable program voltage (e.g., a positive voltage) is applied across the terminals of two-terminal memory cell 100, ions from active metal layer 110 move into the adjacent interface layer 106, which is at least partially permeable to the ions that collectively form conductive filament 202. Conductive filament 202 can span the entire thickness or a portion of the interface layer 106, facilitating increased electrical conductivity through the interface layer 106, which otherwise has a high electrical resistance.

When the program voltage is applied and conductive filament 202 forms, the memory cell is said to be in the on-state, which is a low-resistance state. In response to a suitable erase voltage (e.g., a negative voltage), conductive filament 202 can at least in part deform or retract, breaking the electrical conductive path. Such is a high-resistance state, associated with an off-state. The state can be determined by measuring current through cell 100 when a suitable read voltage is applied. The read voltage generally is not sufficient (or the proper polarity) to either form or disperse conductive filament 202, so current readings associated with the read current can be used to determine if the cell is in the high-resistance state (e.g., off) or the low-resistance state (e.g., on). In this example, two-terminal memory cell 100 is in the on state, with conductive filament spanning a significant portion of interface layer 106.

Figure 3A:
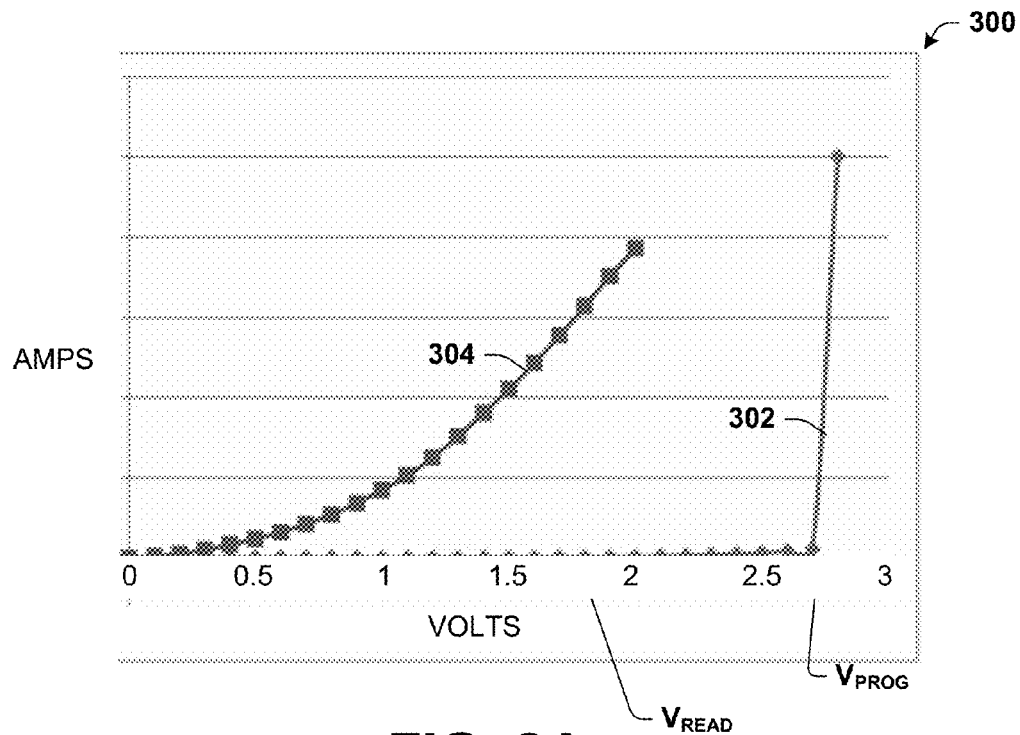
FIG. 3A illustrates an example graph that depict current over voltage characteristics for an example two-terminal memory device that switches states in response to a program voltage in accordance with certain embodiments of this disclosure.
Figure 3B:
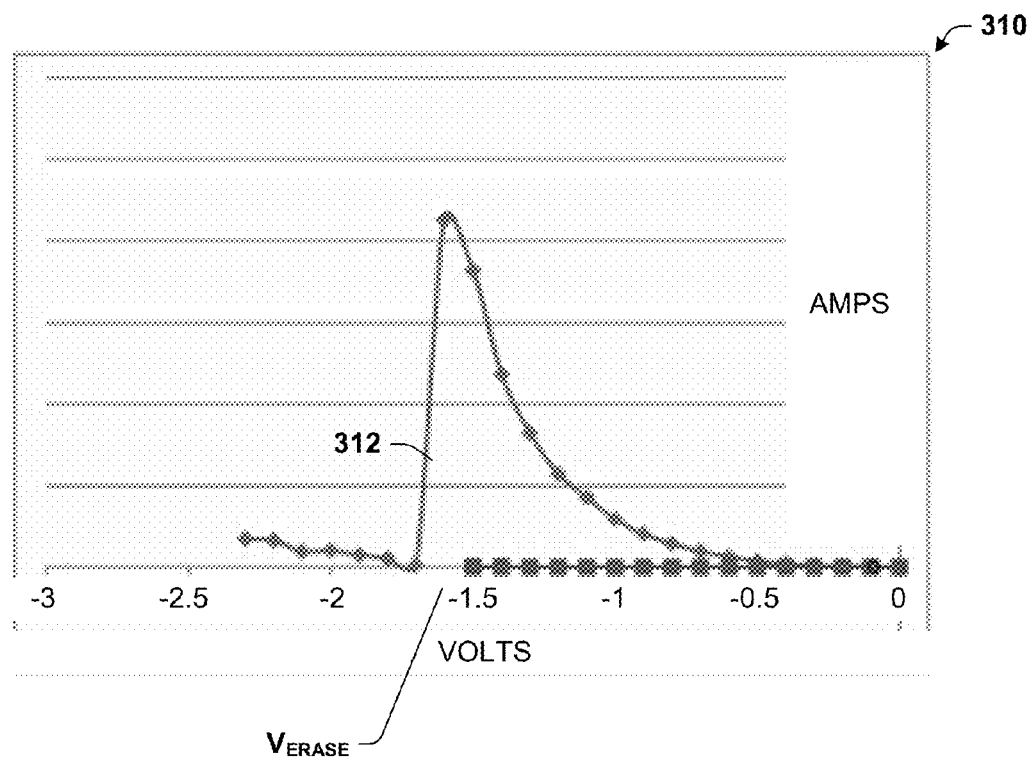
FIG. 3B illustrates an example graph that depict current over voltage characteristics for an example two-terminal memory device that switches states in response to an erase voltage in accordance with certain embodiments of this disclosure.

FIGS. 3A and 3B are intended to be examined in conjunction with FIG. 2 and depict example graphs 300 and 310 that depict current over voltage characteristics for an example cell 100 that switches states in response to a program voltage (e.g., graph 300) and an erase voltage (e.g., graph 310). Graph 300 primarily illustrates a switch from a relatively high resistance state (e.g., an off state) to a relatively low resistance state (e.g., an on state) in response to a program voltage, which is depicted by plot 302. In this example, the program voltage, $V_{prog}$, is between 2.5 V and 3 V. Therefore, when $V_{prog}$ is applied to terminal 114 (or $V_{terminal\ 114} - V_{terminal\ 112} \geq V_{prog}$) and cell 100 is in an off state, which is a relatively high resistance state in which conductive filament 202 is not formed, then cell 100 can switch to an on state, which is a relatively low resistance state due to formation of conductive filament 202. As plot 302 illustrates, current measured through cell 100 can be at or near zero until the switch the on state occurs, at which point current through cell 100 induced by a given voltage can increase many orders of magnitude versus a current measured when in the off state.

As a result of such switching characteristics, a read voltage, $V_{read}$, can be applied at any time, for instance about 1 or 2 volts or substantially any value that does not equal or go beyond $V_{prog}$. Measured current through cell 100 in response to $V_{read}$ can be indicative of a current state for cell 100, and this state (e.g., off/on) can map to a logical zero or one of a binary bit. For example, if cell 100 is in an off state (e.g., relatively high resistance state in which conductive filament 202 is not formed), then current readings associated with $V_{read}$ can measure very close to zero, as indicated by plot 302. On the other hand, if cell 100 is in an on state (e.g., relatively low resistance state in which conductive filament 202 is formed), then current readings associated with $V_{read}$ can differ significantly, as illustrated by plot 304.

Graph 310 primarily illustrates a switch from a relatively low resistance state (e.g., an on state) to a relatively high resistance state (e.g., an off state) in response to an erase voltage, $V_{erase}$. In this example, $V_{erase}$ can be about −1.5 volts. Thus, when $V_{erase}$ is applied to terminal 112 (or $V_{terminal\ 112} - V_{terminal\ 114} \leq V_{erase}$) and cell 100 is in an on state, which is a relatively low resistance state in which conductive filament 202 is formed, then cell 100 can switch to an off state, which is a relatively high resistance state that exists in absence of conductive filament 202. Such is illustrated by plot 312.

Still referring to FIGS. 1A-3B, in some embodiments, active region 102 can have a relatively low resistance within a range of about 10 kilo-ohms to about 5 mega-ohms in response to memory cell 100 being in an on state. Active region 102 can have a relatively high resistance within a range of about 5 mega-ohms to about 100 mega-ohms in response to memory cell 100 being in an off state. In some embodiments, memory cell 100 can switch from the off state to the on state in response to a program voltage, $V_{prog}$, in a range of about 2 volts to about 6 volts. The memory cell can switch from the on state to the off state in response to an erase voltage, $V_{erase}$, that can be in a range from about −1.5 volts to about −6 volts. A read voltage, $V_{read}$, which can be either polarity and, can have a magnitude that is in a range bounded by $V_{erase}$ and $V_{progr}$, and thus not significant enough to either create or disperse conductive filament 202, can be employed to determine a current state for cell 100 based on a measured current through cell 100 in response to $V_{read}$.

It should be appreciated that a variety of resistive switching memory cell technologies exist, having different physical properties. For instance, some embodiments of the subject disclosure can have different discrete programmable resistances, different associated program/erase voltages, as well as other differentiating characteristics. For instance, in a unipolar embodiment, once a memory cell is initially programmed, the memory cell can be later programmed in response to a first positive voltage (e.g., three volts) and erased in response to a second positive voltage (e.g., between four and five volts). Other embodiments can alternatively exhibit bipolar characteristics, and become programmed in response to a positive voltage and erased in response to a negative voltage or vice versa. Where an embodiment does not specify a unipolar or bipolar characteristic, or does not indicate suitable program/erase voltages, it is intended that such aspects and embodiments incorporate any suitable memory cell technology and can be operated by program/erase voltages appropriate to that memory cell technology, as would be known by one of ordinary skill in the art or made known by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

Compatibility with complementary metal oxide semiconductor (CMOS) fabrication processes is believed by the inventors of the present disclosure to be a significant factor related to fabrication cost reduction for new types of electronic memory. Some proposed resistive-switching memory cells are constrained by CMOS fabrication constraints, including process temperature(s), memory cell material(s), wiring or electrode material(s), memory cell material(s), dopant material(s), and so forth. For example, to avoid overhead costs in retooling CMOS fabrication equipment, embodiments of the resistive-switching memory can often involve memory elements built on a Si wafer. Interconnecting the Si wafer and the memory elements can involve several layers of interconnects, often involving metals such as Aluminum (Al) or Copper (Cu). Due to relatively low softening temperatures of these metals, fabrication of the memory elements can be constrained to 450 degrees Celsius or lower (e.g., for Al interconnect technology).

The inventors of the subject application are familiar with additional non-volatile, two-terminal memory structures. For example, ferroelectric random access memory (RAM) is one example. Some others include magneto-resistive RAM, organic RAM, phase change RAM and conductive bridging RAM, and so on. Many of these devices include materials that are incompatible with many common CMOS fabrication processes. Accordingly, expensive fabrication overhead costs (e.g., retooling, redesign, retesting, etc.) are projected in association with producing these devices. In addition, these devices can exhibit relatively slow switching speeds, small on/off resistance ratios (e.g., leading to small sensing margin) or poor thermal stability, as well as other problems. Accordingly, many techniques disclosed herein, e.g., with reference to FIG. 5, can accommodate creation of sub-oxide 108 on a CMOS substrate. For example, techniques disclosed herein can be below suitable temperature budgets associated with CMOS substrates and can in some embodiments be readily integrated into existing CMOS fabrication processes, such as, e.g., a post etch cleaning process or the like.

Figure 4:
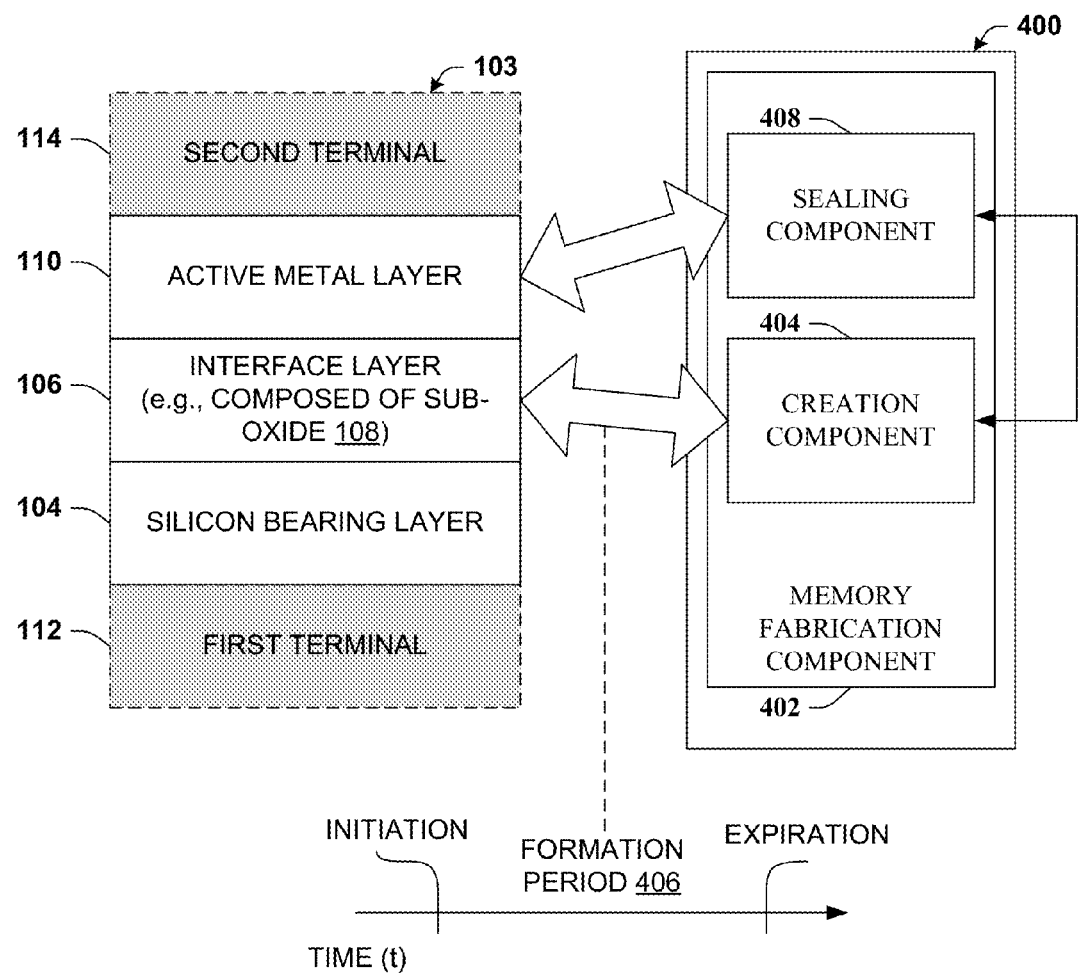
FIG. 4 illustrates a block diagram of an example system that can construct a two-terminal memory device with a silicon sub-oxide comprising an interface layer of the two-terminal memory device during a formation period in accordance with certain embodiments of this disclosure.

Turning now to FIG. 4, system 400 is depicted. System 400 can construct a two-terminal memory device (e.g., device 100) with a silicon sub-oxide (e.g., sub-oxide 108 that can include Silicon, Oxygen, and optionally Germanium) comprising an interface layer (e.g., interface layer 106) of the two-terminal memory device. In various embodiments system 400 may include a variety of stand-alone semiconductor fabrication machines, including steppers, deposition chambers, etching chambers, sputtering chambers, and the like. In various embodiments, system 400 may include a number of different fabrication devices from different vendors, that may or may not directly interface with each other.

In various embodiments, system 400 can employ one or more techniques detailed herein in connection with creating sub-oxide 108 and/or interface layer 106. System 400 can include a memory that stores computer executable components and a processor that executes computer executable components stored in the memory, examples of which can be found with reference to FIG. 10. It is to be appreciated that the computer 1002 can be used in connection with implementing one or more of the systems or components shown and described in connection with FIG. 4 or other figures disclosed herein. As depicted, system 400 can include a memory fabrication component 402 that can include a creation component 404 and a sealing component 408.

Memory fabrication component 402 can be configured to facilitate fabrication of two-terminal memory cell 100 with active region 102. Active region 102 can include silicon bearing layer 104, interface layer 106 comprising a non-stoichiometric sub-oxide 108 situated atop silicon bearing layer 104, and active metal layer 110 situated atop interface layer 106.

Creation component 404 can be configured to facilitate creation of interface layer 106 during a formation period 406. Interface layer 106 can be less than or equal to about 8 nanometers in thickness. Creation component 404 can employ many different techniques for creating interface layer 106 and/or an associated silicon sub-oxide 108, many of which are described in connection with FIG. 5. For example, creation component 404 can facilitate growth of sub-oxide 108, deposition of sub-oxide 108 or a film that grows or otherwise create sub-oxide 108, transformation of an extant film into sub-oxide 108, etc. Given the many techniques disclosed herein, formation period 406 can vary as a function of the technique utilized or operating characteristics desired, but will typically have a discrete initiation time at which formation period 406 begins and an expiration time at which formation period 406 ends. In some embodiments, initiation of formation period 406 can occur after a cleaning process and expiration of formation period 406 can occur when active metal layer 110 is deposited, after which changes to interface layer 106 become less feasible and/or the state of interface layer 106 is substantially suspended as-is.

As such, sealing component 408 can be configured to deposit active metal layer 110 in response to expiration of formation period 406. In some embodiments, silver or another metal or compound comprising active metal layer 110 can be deposited according to a subtractive/reduction process (e.g., deposited by either evaporation, sputter, or electroplating), a patterning process, an etching process, or by a Damascene process. In some embodiments, active metal layer 110 can have a thickness in a range of about 10 nanometers to about 100 nanometers. Hence, an aggregate thickness of active region 102 can be in a range of about 20 nanometers to about 300 nanometers.

With reference now to FIG. 5, system 500 is illustrated. System 500 provides numerous example sub-oxide 108 creation techniques. For example, reference numeral 502 illustrates a first example technique employed by creation component 404 to facilitate creation of interface layer 106 can relate to growing sub-oxide 108 on silicon bearing layer 104. In some embodiments, sub-oxide 108 can be grown according to the first example technique in ambient air at a relatively low temperature of about 20 C to about 100 C with a formation period 406 that last up to about 24 hours. In some embodiments, the first example technique can include a hydrogen fluoride (HF) treatment, a chemical-mechanical planarization (CMP) treatment, or a sputter etch treatment with argon prior to expiration of formation period 406.

In some embodiments, creation component 404 can facilitate creation of interface layer 106 by way of a second example technique, which is illustrated by reference numeral 504. The second technique can comprise a chemical wet treatment that exposes silicon bearing layer 104 or an extant film included in interface layer 106 to a chemical wet oxidizing source. In some embodiments, the oxidizing source can be one of or a suitable combination of: nitric acid ($HNO_3$), hydrogen peroxide ($H_2O_2$), ozone ($O_3$), water, ($H_2O$), dilute HF, sulfuric acid ($H_2SO_4$), ammonium hydroxide ($NH_4OH$), or hydrochloric acid (HCl). The chemical wet treatment can occur in a temperature range of between about 20 C to about 80 C and can be applied for up to about 15 minutes.

In accordance with a third example technique, depicted by reference numeral 506, creation component 404 can facilitate creation of interface layer 106 by way of a plasma treatment. The plasma treatment can be applied to silicon bearing layer 104 or an extant film included in interface layer 106. In some embodiments, formation period 406 can extend from about 1 minute to about 5 minutes at a temperature of up to about 250 C. The plasma treatment can include one of or a combination of oxygen, hydrogen, nitrous oxide, or other suitable elements in a plasma state.

Creation component 404 can facilitate creation of interface layer 106 by way of a fourth example technique described by reference numeral 508. For example, creation component 404 can insert or otherwise include a metal layer (e.g., reduction metal layer 128) in a film included in interface layer 106. The film in which the metal layer is included can be an extant silicon oxide film or sub-oxide 108 created according to a different technique and augmented with the metal layer. The metal layer can have a thickness that is less than about four nanometers and can comprise one of or a compound of aluminum, tungsten, nickel, titanium, copper, cobalt, molybdenum or another metal that bonds with silicon oxide and, e.g., due to a higher energy, reduces an amount of oxygen in the oxide during a bonding process.

According to a fifth example technique detailed in connection with reference numeral 510, creation component 404 can facilitate creation of interface layer 106 by way of a silicon deposition process. Creation component 404 can deposit silicon or a derivative of silicon on an extant film or sub-oxide 108 constructed according to another technique, or on silicon bearing layer 104. These deposits, which can include silicon can, when exposed to an ambient environment that include oxygen, undergo an oxidation process that can yield sub-oxide 108. In some embodiments, the deposits can be patterned according to a defined arrangement. The ambient environment that includes oxygen can be in a temperature range of about 100 C to about 500 C and formation period 406 can be up to one hour.

Creation component 404 can facilitate creation of sub-oxide 108 in connection with a sixth technique denoted at reference numeral 512. For instance, the sixth technique can comprise high dose oxygen implantation in an extant film included in interface layer 106. The extant film can include silicon or a derivative of silicon and can be sub-oxide 108 that is in an intermediate stage created by way of a different technique. The high dose oxygen implantation can have a dose coefficient of up to about $1E16$ $cm^2$ at an energy of up to about 500 kilo-electron-volts. In some embodiments, the beam current density can be up to about 0.2 $mA/cm^2$. The temperature can be up to about 200 C.

In some embodiments, creation component 404 can facilitate creation of interface layer 106 by way of a seventh example technique described in connection with reference numeral 514. The seventh example technique can comprise an ion bombardment process that can bombard a silicon dioxide ($SiO_2$) film included in interface layer 106 with certain ions. These ions can be produced from one of or a combination of, e.g., argon, neon, krypton, xenon, silicon, germanium, or the like. In some embodiments, an energy associated with the ion bombardment can be up to about 2 kilo-electron-volts. In some embodiments, a dose coefficient associated with the ion bombardment can be up to about $1E16$ $cm^2$. The beam current density can be up to about 0.2 $mA/cm^2$. The temperature can be up to about 200 C.

It is appreciated that all or a portion of the techniques employed by creation component 404 to create interface layer 106 comprising sub-oxide 108 can include a cleaning process prior to initiation of formation period 406. Such a cleaning process can remove extant oxides from silicon bearing layer 104 or from an extant film included in interface layer 106 that is in an intermediate state and/or provides a medium out of which to create sub-oxide 108. Furthermore, all or portions of the techniques employed by creation component 404 to create interface layer 106 comprising sub-oxide 108 can include one or more processes relating to patterning or etching, certain examples of which are provided with reference to FIGS. 6A and 6B. Such can occur following termination of formation period 406 or, in some embodiments, during formation period 406.

Figure 6A:
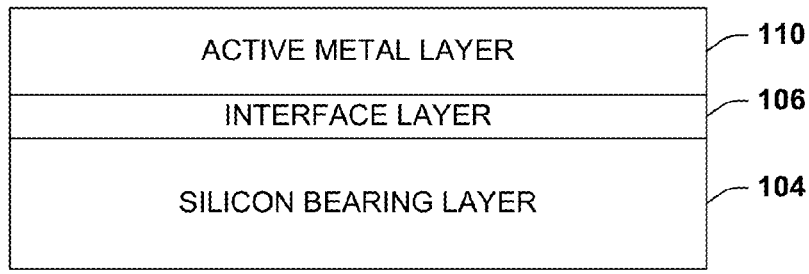
FIG. 6A depicts an example formation of the interface layer in connection with a deposit metal/etch scheme in accordance with certain embodiments of this disclosure.
Figure 6B:
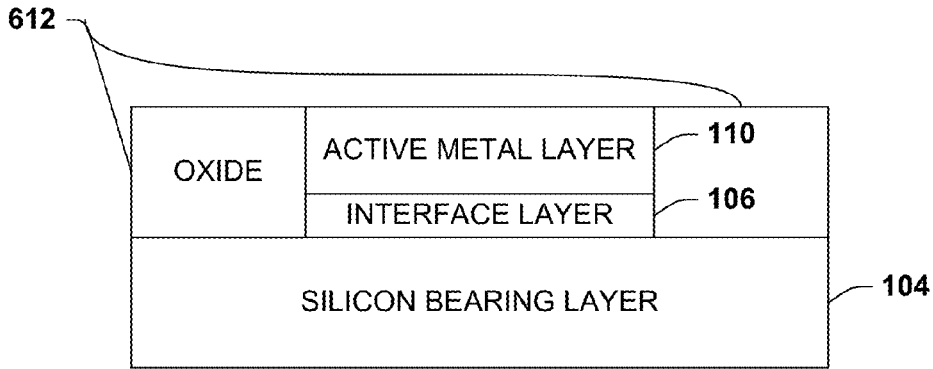
FIG. 6B depicts an example formation of the interface layer in connection with an etch/deposit metal scheme in accordance with certain embodiments of this disclosure.

FIGS. 6A and 6B relate to two different example fabrication techniques. Turning now to FIG. 6A, example 600 is provided. Example 600 relates to formation of interface layer in connection with a deposit metal/etch scheme. In contrast, example 610 of FIG. 6B relates to formation of interface layer 106 in connection with an etch/deposit metal scheme. In the latter example (e.g., example 610), oxide 612 has been etched to produce a central aperture in which interface layer 106 can be grown or otherwise formed and active metal layer 110 deposited.

Figure 6C:
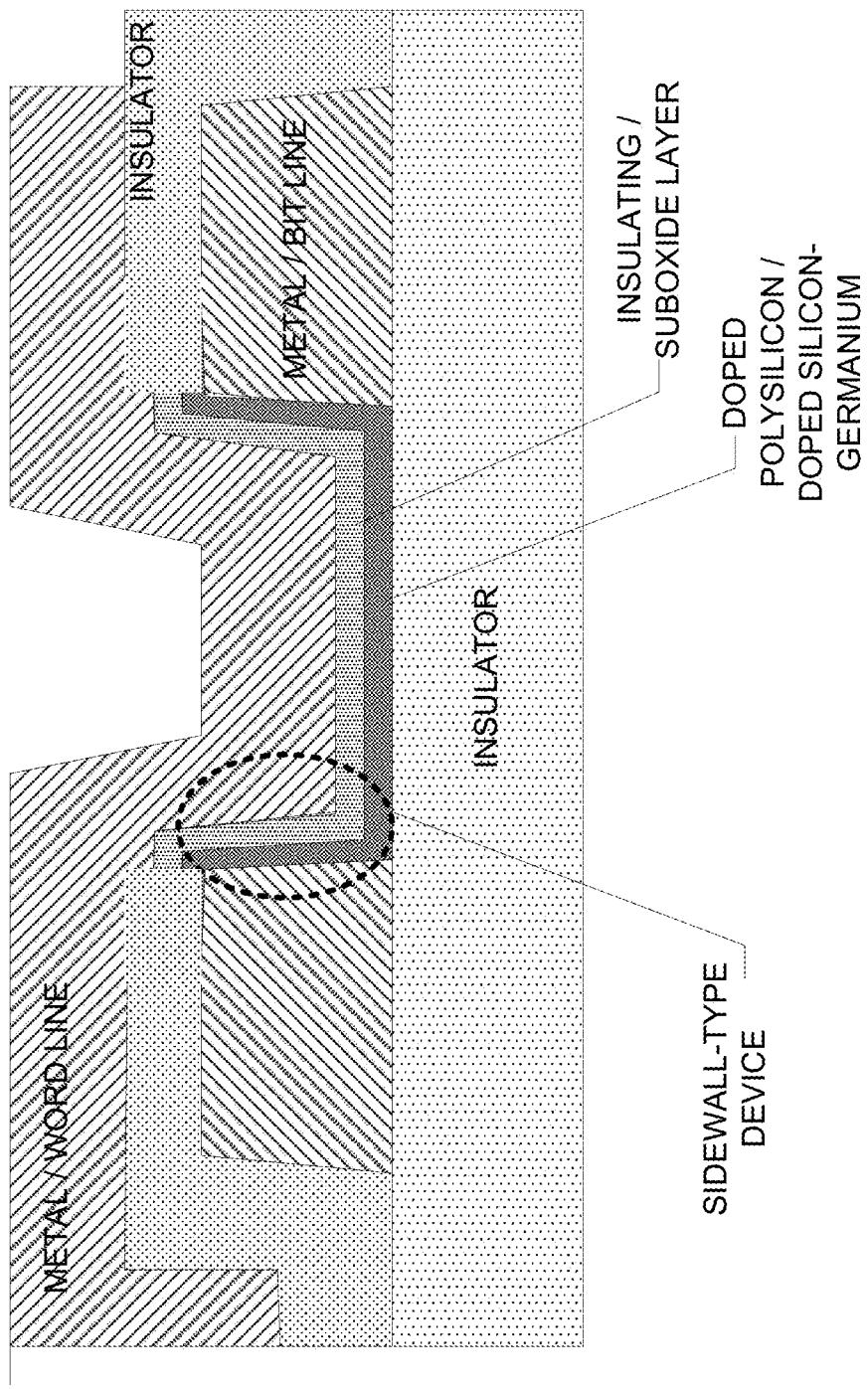
FIG. 6C illustrates an example sidewall-type memory device, that can relate to the disclosed subject matter.

FIG. 6C illustrates an example sidewall-type memory device, that can relate to the disclosed subject matter. For example, memory device 100 or portions thereof can be situated sideways or laterally in a sidewall arrangement. Such a sidewall-type device can include doped polysilicon and/or doped silicon-germanium adjacent to and in physical contact with a sub-oxide layer (e.g., sub-oxide 108) and/or an interface layer (e.g., interface layer (106).

Example Methods for Creating a Silicon Sub-Oxide for Two-Terminal Memory

The aforementioned diagrams have been described with respect to interaction between several components, or memory architectures. It should be appreciated that such diagrams can include those components and architectures specified therein, some of the specified components/architectures, and/or additional components/architectures. Sub-components can also be implemented as electrically connected to other sub-components rather than included within a parent architecture. Additionally, it is noted that one or more disclosed processes can be combined into a single process providing aggregate functionality. For instance, a program process can comprise an erase process, or vice versa, to facilitate programming and erasing a semiconductor cell by way of a single process. In addition, it should be appreciated that respective rows of multiple cell memory architectures can be erased in groups (e.g., multiple rows erased concurrently) or individually. Moreover, it should be appreciated that multiple memory cells on a particular row can be programmed in groups (e.g., multiple memory cells programmed concurrently) or individually. Components of the disclosed architectures can also interact with one or more other components not specifically described herein but known by those of skill in the art.

Figure 7:
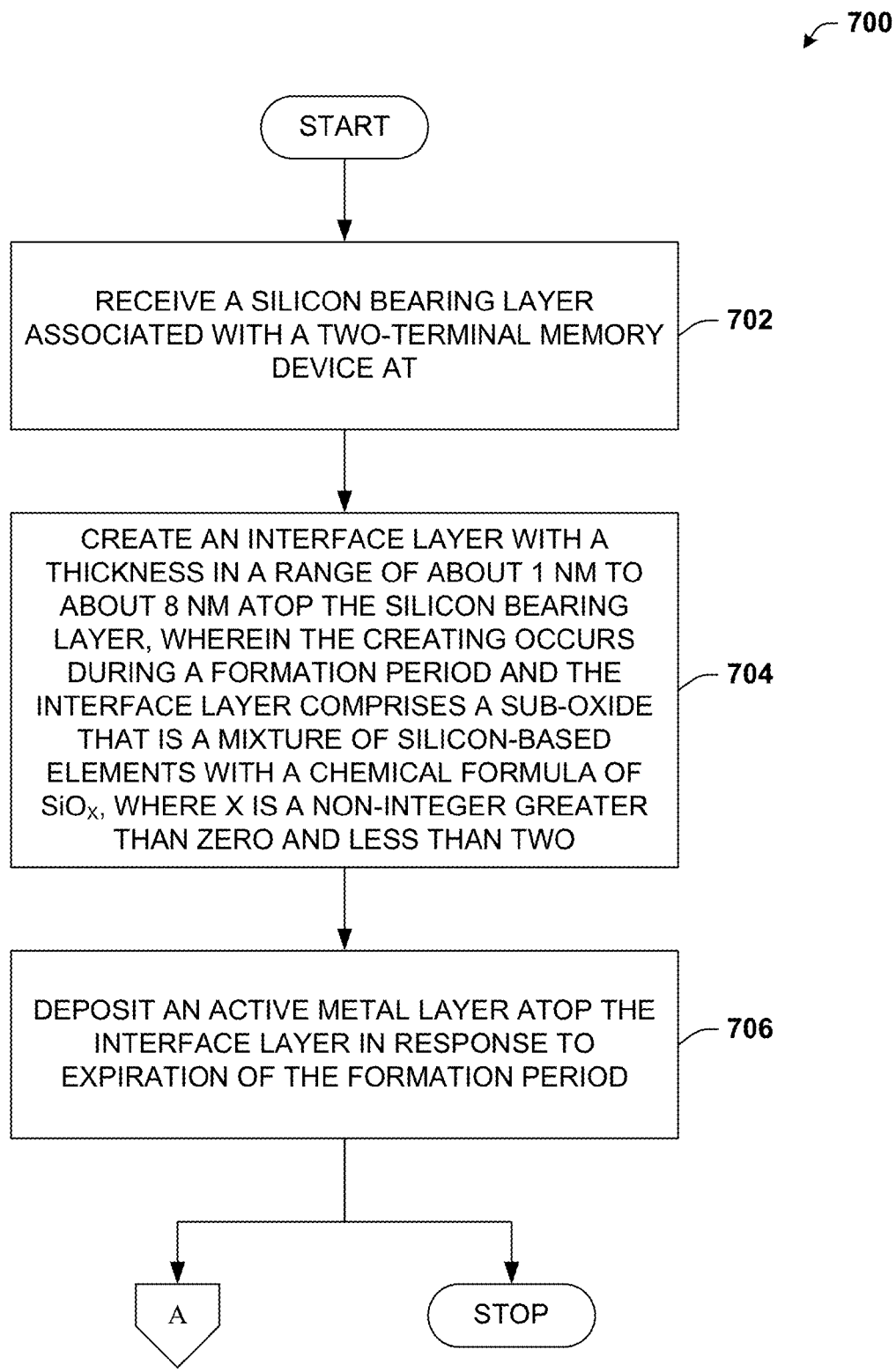
FIG. 7 illustrates an example methodology that can provide for creating a silicon sub-oxide that comprises an interface layer of a two-terminal memory device in accordance with certain embodiments of this disclosure.
Figure 8:
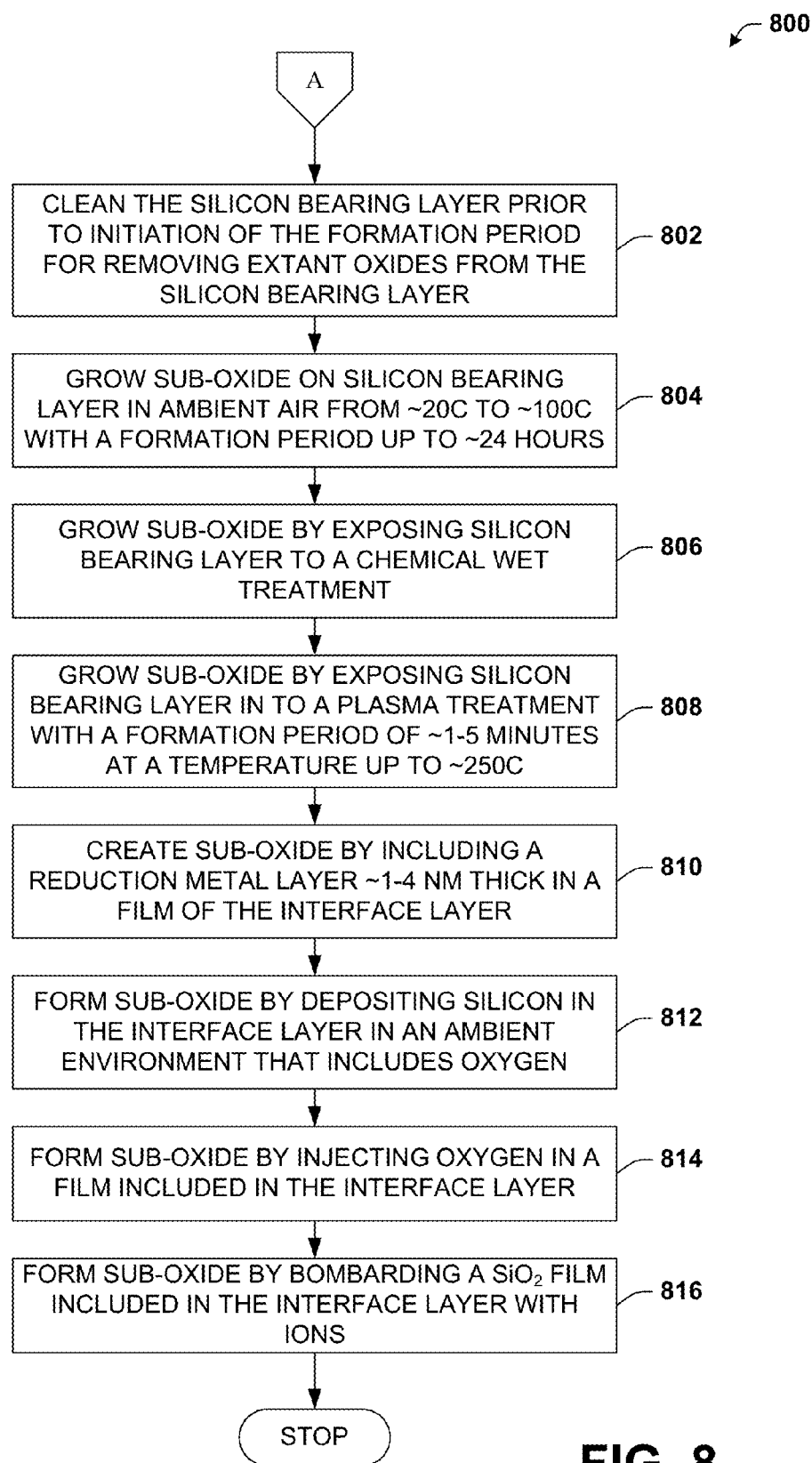
FIG. 8 illustrates an example methodology that can provide for numerous techniques in connection with creating the interface layer comprising the sub-oxide in accordance with certain embodiments of this disclosure.

In view of the exemplary diagrams described supra, process methods that can be implemented in accordance with the disclosed subject matter will be better appreciated with reference to the flow chart of FIGS. 7 and 8. While for purposes of simplicity of explanation, the method of FIGS. 7 and 8 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 7 illustrates exemplary method 700. Method 700 can provide for forming or creating a silicon sub-oxide that comprises an interface layer of a two-terminal memory device. For example, at reference numeral 702, a silicon bearing layer associated with a two-terminal memory device can be received or formed. In some embodiments, the silicon bearing layer can be adjacent to and in physical contact with a first terminal of the two-terminal memory device, wherein the first terminal comprises a conductive metal layer. In some embodiments, the silicon bearing layer can exist atop or adjacent to a CMOS substrate, in which case a creation process that occurs at relatively high temperatures (e.g., above about 300 C to about 470 C) can damage or ruin elements of the CMOS substrate. In other embodiments, no significant temperature threshold need be observed. In some embodiments, certain temporal constraints can exist relating to timing associated with the creation of the sub-oxide, while in other embodiments, no significant temporal constraints exist.

At reference numeral 704, an interface layer with a thickness in a range of about one nanometer to about eight nanometers can be formed or created atop or adjacent to the silicon bearing layer. The creating at reference numeral 704 can occur during a defined formation period and the interface layer can comprise a sub-oxide that is a mixture of silicon-based elements or compounds with a chemical formula of $SiO_X$, where X is a non-integer greater than zero and less than two.

At reference numeral 706, an active metal layer can be deposited atop or adjacent to the sub-oxide in response to expiration of the formation period. The active metal layer can be deposited according to a subtractive/reduction process (e.g., deposited by either evaporation, sputter, or electroplating), a patterning process, an etching process, or by a Damascene process. In some embodiments, active metal layer 110 can have a thickness in a range of about 10 nanometers to about 100 nanometers.

With reference now to FIG. 8, example method 800 is depicted. Method 800 can provide for numerous techniques in connection with creating the interface layer comprising a sub-oxide. For instance, at reference numeral 802, the silicon bearing layer or an extant film included in the interface layer can be cleaned prior to the facilitating creation of the sub-oxide that can occur in connection with reference numeral 704 of FIG. 7. Cleaning the silicon bearing layer or extant film can include removing certain oxides, contaminants, or other undesired elements that exist on the silicon bearing layer or extant film prior to the cleaning. Completion of the cleaning can coincide with initiation of the formation period.

Reference numerals 804-816 relate to numerous example techniques by which the interface layer can be created includes the sub-oxide. These example techniques are intended to be exemplary in nature and are typically alternatives, but are not construed to be limiting, as other techniques or combinations of techniques can exist. The techniques by which the sub-oxide can be created can relate to creation by growth, by deposition, by a transformation, or another process. In some cases, two or more techniques can be combined and/or employed in combination. Selection of a particular technique over others can be based on target operating characteristics for the two-terminal memory device and/or based on existing facilities, equipment, or other factors.

At reference numeral 804, the sub-oxide can be grown on the silicon bearing layer in ambient air from about 20 C to about 100 C. The formation period can be up to about 24 hours. In some embodiments, a hydrogen fluoride (HF) treatment, a chemical-mechanical planarization (CMP) treatment, or a sputter etch treatment with argon can be applied prior to expiration of the formation period At reference numeral 806, the sub-oxide can be grown by exposing the silicon bearing layer or an extant film included in the interface layer to a chemical wet treatment. The chemical wet treatment can expose the silicon bearing layer or an extant film included in the interface layer to an oxidizing source. In some embodiments, the oxidizing source can be one of or a mixture of nitric acid ($HNO_3$), hydrogen peroxide ($H_2O_2$), ozone ($O_3$), water, ($H_2O$), dilute HF, sulfuric acid ($H_2SO_4$), ammonium hydroxide ($NH_4OH$), or hydrochloric acid (HCl).

At reference numeral 808, the sub-oxide can be grown by exposing the silicon bearing layer or an extant film included in the interface layer to a plasma treatment. The plasma treatment can last for about one minute to about five minutes and can be applied at a temperature of up to about 250 C. The plasma employed for the plasma treatment can comprise oxygen and/or hydrogen in a plasma state.

At reference numeral 810, the sub-oxide can be created by including a reduction metal layer in a range of about one nanometer to about four nanometers in thickness in an extant film included in the interface layer. In some embodiments, the reduction metal layer can comprise one of or a compound of aluminum, tungsten, nickel, titanium, copper, cobalt, molybdenum or another metal that bonds with an oxide of the extant film and reduces an amount of oxygen included in the oxide of the film. For example, applying a reduction metal layer to a layer of $SiO_2$ can form a sub-oxide with the reduction metal layer, a SiO layer and an $SiO_2$ layer.

At reference numeral 812, the sub-oxide can be formed by depositing silicon in the interface layer in an ambient environment that includes oxygen. These deposits of silicon can bond with oxygen included in the ambient environment to form the sub-oxide. The ambient environment can be at a temperature in a range of about 100 C to about 500 C and the formation period can be up to about one hour. In some embodiments, a thin silicon layer may be formed, then exposed to an oxygen ambient. In such embodiments, the thin silicon layer may be partially or completely consumed to form the sub-oxide layer, or the like.

At reference numeral 814, the sub-oxide can be formed by injecting oxygen in a film included in the interface layer. For example, high dose oxygen implantation can employed that can facilitate oxidation in lower layers of the interface layer. The high does oxygen implantation can have a dose coefficient up to about $1E16$ $cm^2$ at an energy of up to about 500 kilo-electron-volts.

At reference numeral 816, the sub-oxide can be formed by bombarding a $SiO_2$ film included in the interface layer with ions. In some embodiments, the ion bombardment can have an energy of up to about 2 kilo-electron-volts and a dose coefficient up to about $1E16$ $cm^2$. In some embodiments, the ions can be supplied from a source that includes one of or a mixture of argon, neon, krypton, xenon, silicon, or germanium.

What has been described herein can be implemented various systems or apparatuses. For example, such a system or apparatus, in some embodiments can comprise a memory fabrication component that facilitates fabrication of a two-terminal memory cell with an active region comprising a silicon bearing layer, an interface layer comprising a non-stoichimetric sub-oxide situated atop the silicon bearing layer, and an active metal layer situated atop the interface layer. The memory fabrication component can comprise a creation/formation component that facilitates creation of the interface layer during a formation period, wherein the interface layer has a thickness that is less than about 8 nanometers. The memory fabrication component can further comprise a sealing component that deposits the active metal layer in response to expiration of the formation period.

In some embodiments, the sub-oxide comprises a mixture of silicon (Si), silicon dioxide ($SiO_2$), and silicon monoxide (SiO) and is represented as $SiO_X$, where $0<X<2$.

In some embodiments, the silicon bearing layer is a positive (p) type semiconductor with a thickness in a range of about 20 nanometers to about 250 nanometers and with a doping coefficient in a range of about 0.001 ohm-cm to about 10 ohm-cm.

In some embodiments, the active region has a relatively low resistance within a range of about 10 kilo-ohms to about 5 mega-ohms in response to the memory cell being in an on state; and a relatively high resistance within a range of about 5 mega-ohms to about 100 mega-ohms in response to the memory cell being in an off state.

In some embodiments, the two-terminal memory cell switches from the off state to the on state in response to a program voltage in a range of about 2 volts to about 6 volts and the memory cell switches from the on state to the off state in response to an erase voltage in a range of about −1.5 volts to about −6 volts.

In some embodiments, the creation component facilitates cleaning of the silicon bearing layer prior to initiation of the formation period, wherein the cleaning comprises removal of oxide from the silicon bearing layer.

In some embodiments, the creation component facilitates creation of the interface layer by way of a first technique that comprises growing the sub-oxide on the silicon bearing layer in ambient air that is in a range of about 20 degrees Celsius (C) to about 100 degrees C., wherein the formation period extends up to about 24 hours.

In some embodiments, the first technique includes a hydrogen fluoride (HF) treatment, a chemical-mechanical planarization (CMP) treatment, or a sputter etch treatment with argon prior to expiration of the formation period.

In some embodiments, the creation component facilitates creation of the interface layer by way of a second technique that comprises a chemical wet treatment that exposes the silicon bearing layer to an oxidizing source.

In some embodiments, the oxidizing source is at least one of nitric acid ($HNO_3$), hydrogen peroxide ($H_2O_2$), ozone ($O_3$), water, ($H_2O$), dilute HF, sulfuric acid ($H_2SO_4$), ammonium hydroxide ($NH_4OH$), or hydrochloric acid (HCl).

In some embodiments, the creation component facilitates creation of the interface layer by way of a third technique that comprises a plasma treatment applied to the silicon bearing layer, wherein the formation period extends from about 1 minute to about 5 minutes at a temperature of up to about 250 degrees C.

In some embodiments, the plasma treatment includes at least one of oxygen ($O_2$) or hydrogen ($H_2$) in a plasma state.

In some embodiments, the creation component facilitates creation of the interface layer by way of a fourth technique that comprises including a metal layer in film included in the interface layer, wherein a thickness for the metal layer is less than about 4 nanometers.

In some embodiments, the metal layer comprises at least one of or a compound of aluminum, tungsten, nickel, titanium, copper, cobalt, molybdenum or another metal that bonds with an oxide of the film and reduces an amount of oxygen included in the oxide.

In some embodiments, the creation component facilitates creation of the interface layer by way of a fifth technique that comprises a deposition of silicon in the interface layer in an ambient environment that includes oxygen.

In some embodiments, the ambient environment is at a temperature in a range of about 100 degrees C. to about 500 degrees C. and the formation period is up to about one hour.

In some embodiments, the creation component facilitates creation of the interface layer by way of a sixth technique that comprises high dose oxygen implantation in a film included in the interface.

In some embodiments, the high dose oxygen implantation has a dose coefficient up to about 1E16 $cm^2$ at an energy of up to about 500 kilo-electron-volts.

In some embodiments, the creation component facilitates creation of the interface layer by way of a seventh technique that comprises ion bombardment of a silicon dioxide ($SiO_2$) film included in the interface layer.

In some embodiments, the ion bombardment comprises at least one of argon, neon, krypton, xenon, silicon, or germanium with an energy of up to about 2 kilo-electron-volts and a dose coefficient up to about 1E16 $cm^2$.

In some embodiments, the active region has a thickness and width in a range of about 20 nanometers to about 300 nanometers.

Example Operating Environments

Figure 9:
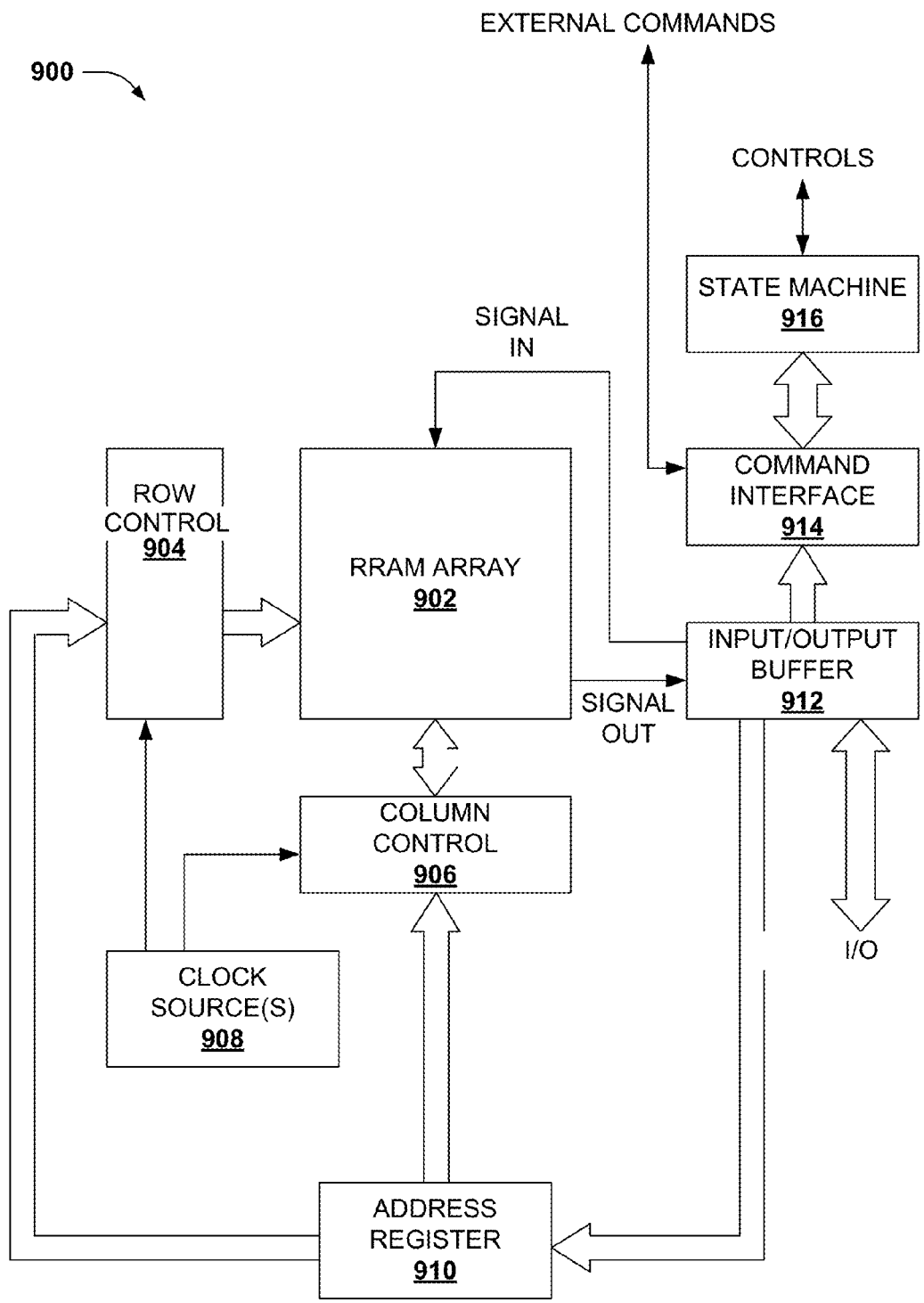
FIG. 9 illustrates a block diagram of an example electronic operating environment in accordance with certain embodiments of this disclosure.

In order to provide a context for the various aspects of the disclosed subject matter, FIG. 9, as well as the following discussion, is intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, hand-held computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory (e.g. CF card, USB memory stick, SD card, microSD card), or the like. In a distributed computing environment, program modules can be located in both local and remote memory storage modules or devices.

FIG. 9 illustrates a block diagram of an example operating and control environment 900 for a RRAM array 902 according to aspects of the subject disclosure. In at least one aspect of the subject disclosure, RRAM array 902 can comprise a variety of RRAM memory cell technology. Particularly, RRAM array can be configured or operated to mitigate or avoid sneak path currents of the RRAM array, as described herein.

A column controller 906 can be formed adjacent to RRAM array 902. Moreover, column controller 906 can be electrically coupled with bit lines of RRAM array 902. Column controller 906 can control respective bitlines, applying suitable program, erase or read voltages to selected bitlines.

In addition, operating and control environment 900 can comprise a row controller 904. Row controller 904 can be formed adjacent to column controller 906, and electrically connected with word lines of RRAM array 902. Row controller 904 can select particular rows of memory cells with a suitable selection voltage. Moreover, row controller 904 can facilitate program, erase or read operations by applying suitable voltages at selected word lines.

A clock source(s) 908 can provide respective clock pulses to facilitate timing for read, write, and program operations of row control 904 and column control 906. Clock source(s) 908 can further facilitate selection of word lines or bit lines in response to external or internal commands received by operating and control environment 900. An input/output buffer 912 can be connected to an external host apparatus, such as a computer or other processing device (not depicted) by way of an I/O buffer or other I/O communication interface. Input/output buffer 912 can be configured to receive write data, receive an erase instruction, output readout data, and receive address data and command data, as well as address data for respective instructions. Address data can be transferred to row controller 904 and column controller 906 by an address register 910. In addition, input data is transmitted to RRAM array 902 via signal input lines, and output data is received from RRAM array 902 via signal output lines. Input data can be received from the host apparatus, and output data can be delivered to the host apparatus via the I/O buffer.

Commands received from the host apparatus can be provided to a command interface 914. Command interface 914 can be configured to receive external control signals from the host apparatus, and determine whether data input to the input/output buffer 912 is write data, a command, or an address. Input commands can be transferred to a state machine 916.

State machine 916 can be configured to manage programming and reprogramming of RRAM array 902. State machine 916 receives commands from the host apparatus via input/output interface 912 and command interface 914, and manages read, write, erase, data input, data output, and like functionality associated with RRAM array 902. In some aspects, state machine 916 can send and receive acknowledgments and negative acknowledgments regarding successful receipt or execution of various commands.

To implement read, write, erase, input, output, etc., functionality, state machine 916 can control clock source(s) 908. Control of clock source(s) 908 can cause output pulses configured to facilitate row controller 904 and column controller 906 implementing the particular functionality. Output pulses can be transferred to selected bit lines by column controller 906, for instance, or word lines by row controller 904, for instance.

In connection with FIG. 8, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 10:
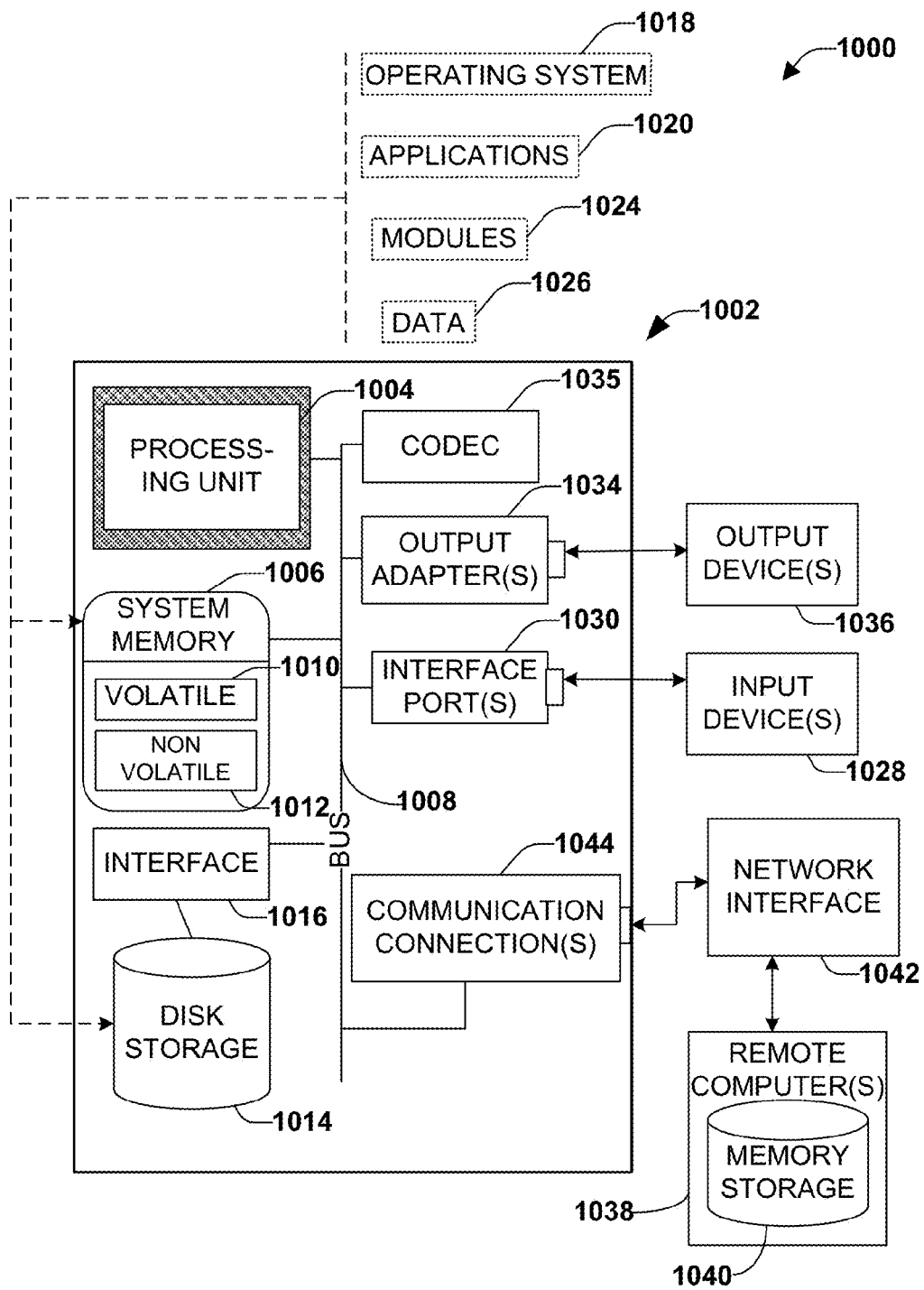
FIG. 10 illustrates an example schematic block diagram for a computing environment in accordance with certain embodiments of this disclosure.

With reference to FIG. 10, a suitable environment 1000 for implementing various aspects of the claimed subject matter includes a computer 1002. The computer 1002 includes a processing unit 1004, a system memory 1006, a codec 1035, and a system bus 1008. The system bus 1008 couples system components including, but not limited to, the system memory 1006 to the processing unit 1004. The processing unit 1004 can be any of various available processors. Dual microprocessors and other multiprocessor architectures also can be employed as the processing unit 1004.

The system bus 1008 can be any of several types of bus structure(s) including the memory bus or memory controller, a peripheral bus or external bus, and/or a local bus using any variety of available bus architectures including, but not limited to, Industrial Standard Architecture (USA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1006 includes volatile memory 1010 and non-volatile memory 1012. The basic input/output system (BIOS), containing the basic routines to transfer information between elements within the computer 1002, such as during start-up, is stored in non-volatile memory 1012. In addition, according to present innovations, codec 1035 may include at least one of an encoder or decoder, wherein the at least one of an encoder or decoder may consist of hardware, software, or a combination of hardware and software. Although, codec 1035 is depicted as a separate component, codec 1035 may be contained within non-volatile memory 1012. By way of illustration, and not limitation, non-volatile memory 1012 can include read only memory (ROM), programmable ROM (PROM), electrically programmable ROM (EPROM), electrically erasable programmable ROM (EEPROM), or flash memory. Volatile memory 1010 includes random access memory (RAM), which acts as external cache memory. According to present aspects, the volatile memory may store the write operation retry logic (not shown in FIG. 10) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM.

Computer 1002 may also include removable/non-removable, volatile/non-volatile computer storage medium. FIG. 10 illustrates, for example, disk storage 1014. Disk storage 1014 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1014 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1014 to the system bus 1008, a removable or non-removable interface is typically used, such as interface 1016. It is appreciated that storage devices 1014 can store information related to a user. Such information might be stored at or provided to a server or to an application running on a user device. In one embodiment, the user can be notified (e.g., by way of output device(s) 1036) of the types of information that are stored to disk storage 1014 and/or transmitted to the server or application. The user can be provided the opportunity to opt-in or opt-out of having such information collected and/or shared with the server or application (e.g., by way of input from input device(s) 1028).

It is to be appreciated that FIG. 10 describes software that acts as an intermediary between users and the basic computer resources described in the suitable operating environment 1000. Such software includes an operating system 1018. Operating system 1018, which can be stored on disk storage 1014, acts to control and allocate resources of the computer system 1002. Applications 1020 take advantage of the management of resources by operating system 1018 through program modules 1024, and program data 1026, such as the boot/shutdown transaction table and the like, stored either in system memory 1006 or on disk storage 1014. It is to be appreciated that the claimed subject matter can be implemented with various operating systems or combinations of operating systems.

A user enters commands or information into the computer 1002 through input device(s) 1028. Input devices 1028 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1004 through the system bus 1008 via interface port(s) 1030. Interface port(s) 1030 include, for example, a serial port, a parallel port, a game port, and a universal serial bus (USB). Output device(s) 1036 use some of the same type of ports as input device(s) 1028. Thus, for example, a USB port may be used to provide input to computer 1002 and to output information from computer 1002 to an output device 1036. Output adapter 1034 is provided to illustrate that there are some output devices 1036 like monitors, speakers, and printers, among other output devices 1036, which require special adapters. The output adapters 1034 include, by way of illustration and not limitation, video and sound cards that provide a means of connection between the output device 1036 and the system bus 1008. It should be noted that other devices and/or systems of devices provide both input and output capabilities such as remote computer(s) 1038.

Computer 1002 can operate in a networked environment using logical connections to one or more remote computers, such as remote computer(s) 1038. The remote computer(s) 1038 can be a personal computer, a server, a router, a network PC, a workstation, a microprocessor based appliance, a peer device, a smart phone, a tablet, or other network node, and typically includes many of the elements described relative to computer 1002. For purposes of brevity, only a memory storage device 1040 is illustrated with remote computer(s) 1038. Remote computer(s) 1038 is logically connected to computer 1002 through a network interface 1042 and then connected via communication connection(s) 1044. Network interface 1042 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1044 refers to the hardware/software employed to connect the network interface 1042 to the bus 1008. While communication connection 1044 is shown for illustrative clarity inside computer 1002, it can also be external to computer 1002. The hardware/software necessary for connection to the network interface 1042 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method for fabricating a two-terminal memory device, comprising:
    forming a conductive silicon bearing layer adjacent to and in physical contact with a first terminal of the two-terminal memory device, wherein the first terminal comprises a conductive metal layer;
    forming an interface layer with a thickness in a range of about 1 nanometer to about 8 nanometers adjacent to and in physical contact with the conductive silicon bearing layer, wherein the interface layer comprises a suboxide that is a mixture of silicon-based compounds with a chemical formula of $SiO_X$, where $0<X<2$; and
    depositing an active metal layer adjacent to and in contact with the interface layer as a second terminal of the two-terminal memory device.

2. The method of claim 1, further comprising cleaning the conductive silicon bearing layer prior to forming the interface layer, to remove extant oxides, if any, from the conductive silicon bearing layer.

3. The method of claim 1, wherein the forming the interface layer comprises growing the sub-oxide on an exposed surface of the conductive silicon bearing layer in ambient air in a range of about 20 degrees C. to about 100 degrees C. for a formation period of up to about 24 hours.

4. The method of claim 1, wherein the forming the interface layer comprises performing a chemical wet treatment by exposing the conductive silicon bearing layer to at least a solution selected from a group consisting of: nitric acid ($HNO_3$), hydrogen peroxide ($H_2O_2$), ozone ($O_3$), water, ($H_2O$), dilute HF, sulfuric acid ($H_2SO_4$), ammonium hydroxide ($NH_4OH$), or hydrochloric acid (HCl).

5. The method of claim 1, wherein the forming the interface layer comprises performing a plasma treatment to the conductive silicon bearing layer for a formation period within a range of about 1 minute to about 5 minutes at a temperature of up to about 250 degrees C.

6. The method of claim 1, wherein the forming the interface layer comprises disposing a reducing metal layer adjacent to and in contact with the conductive silicon bearing layer, wherein a thickness for the reducing metal layer is in a range from about 1 nanometer to about 4 nanometers.

7. The method of claim 6 wherein the reducing metal layer is selected from a group consisting of: aluminum, tungsten, nickel, titanium, copper, cobalt, molybdenum.

8. The method of claim 1, wherein the forming the interface layer comprises depositing silicon in an ambient environment that includes oxygen to thereby form the sub-oxide.

9. The method of claim 1, wherein the forming the interface layer comprises implanting oxygen in a film included in the interface layer to form the sub-oxide.

10. The method of claim 1, wherein the forming the interface layer comprises bombarding ions into a silicon dioxide film included in the interface layer to form the sub-oxide.

11. An apparatus that fabricates a two-terminal memory device, comprising:
a memory to store executable instructions; and
a processor, coupled to the memory, that facilitates execution of the instructions to perform operations, comprising:
forming a conductive silicon bearing layer adjacent to and in physical contact with a first terminal of the two-terminal memory device, wherein the first terminal comprises a conductive metal layer;
forming an interface layer with a thickness in a range of about 1 nanometer to about 8 nanometers adjacent to and in physical contact with the conductive silicon bearing layer, wherein the interface layer comprises a suboxide that is a mixture of silicon-based compounds with a chemical formula of $SiO_X$, where $0<X<2$; and
depositing an active metal layer adjacent to and in contact with the interface layer as a second terminal of the two-terminal memory device.

12. The apparatus of claim 11, wherein the operations further comprise cleaning the conductive silicon bearing layer prior to forming the interface layer.

13. The apparatus of claim 11, wherein the forming the interface layer comprises growing the sub-oxide on an exposed surface of the conductive silicon bearing layer in ambient air in a range of about 20 degrees C. to about 100 degrees C. for a formation period of up to about 24 hours.

14. The apparatus of claim 11, wherein the forming the interface layer comprises performing a chemical wet treatment by exposing the conductive silicon bearing layer to at least a solution selected from a group consisting of:
nitric acid ($HNO_3$), hydrogen peroxide ($H_2O_2$), ozone ($O_3$), water, ($H_2O$), dilute HF, sulfuric acid ($H_2SO_4$), ammonium hydroxide ($NH_4OH$), or hydrochloric acid (HCl).

15. The apparatus of claim 11, wherein the forming the interface layer comprises performing a plasma treatment on the conductive silicon bearing layer for a formation period within a range of about 1 minute to about 5 minutes at a temperature of up to about 250 degrees C.

16. The apparatus of claim 11, wherein the forming the interface layer comprises disposing a reducing metal layer adjacent to and in contact with the conductive silicon bearing layer, wherein a thickness for the reducing metal layer is in a range from about 1 nanometer to about 4 nanometers.

17. The apparatus of claim 16, wherein the reducing metal layer is selected from a group consisting of: aluminum, tungsten, nickel, titanium, copper, cobalt, molybdenum.

18. The apparatus of claim 11, wherein the forming the interface layer comprises depositing silicon in an ambient environment that includes oxygen to thereby form the sub-oxide.

19. The apparatus of claim 11, wherein the forming the interface layer comprises implanting oxygen in a film included in the interface layer to form the sub-oxide.

20. The apparatus of claim 11, wherein the forming the interface layer comprises bombarding ions into a silicon dioxide film included in the interface layer to form the sub-oxide.

21. A two-terminal memory device, comprising:
a conductive silicon bearing layer adjacent to and in physical contact with a first terminal of the two-terminal memory device, wherein the first terminal comprises a conductive metal layer;
an interface layer with a thickness in a range of about 1 nanometer to about 8 nanometers adjacent to and in physical contact with the conductive silicon bearing layer, wherein the interface layer comprises a sub-oxide that is a mixture of silicon-based compounds with a chemical formula of $SiO_X$, where X is a noninteger greater than zero and less than two; and
an active metal layer adjacent to and in contact with the interface layer as a second terminal of the two-terminal memory device.

22. The two-terminal memory device of claim 21, wherein the conductive silicon bearing layer selected from: doped polysilicon, doped silicon-germanium.

23. The two-terminal memory device of claim 21:
wherein the first conductive metal layer is disposed upon a surface of a substrate;
wherein the first conductive metal layer comprises sidewalls disposed at an angle with respect to the surface of the substrate; and
wherein the conductive silicon bearing layer is disposed upon a sidewall of a first terminal of the two-terminal memory device.

24. The two-terminal memory device of claim 21:
wherein the first conductive metal layer is disposed upon a top surface of an insulating substrate; and
wherein the conductive silicon bearing layer is disposed upon a top surface of the first conductive metal layer.

25. The two-terminal memory device of claim 21, wherein the conductive silicon bearing layer has a thickness in a range of between about 20 nanometers to about 250 nanometers.

26. The two-terminal memory device of claim 21, wherein the conductive silicon bearing layer has a doping concentration in a range of about 0.001 ohm-cm to about 10 ohm-cm.

27. The two-terminal memory device of claim 21:
wherein the interface layer includes a titanium capping layer; and
wherein the active metal layer is adjacent to and in physical contact with the titanium capping layer.

28. The two-terminal memory device of claim 21, wherein the mixture of silicon-based compounds further comprises germanium and has a chemical formula of $Si_xGe_yO_z$, where x and y are between zero and one and z is greater than zero and less than two times a sum of x and y.

29. The two-terminal memory device of claim 21, further comprising:
an insulating substrate including a plurality of complementary metal oxide semiconductor (CMOS) devices;
wherein the first terminal is formed upon the insulating substrate; and
wherein the first terminal is coupled to at least one of the plurality of CMOS devices.

* * * * *